United States Patent
Ahn et al.

(10) Patent No.: US 7,499,364 B2
(45) Date of Patent: Mar. 3, 2009

(54) MULTI-PORT SEMICONDUCTOR MEMORY DEVICE AND SIGNAL INPUT/OUTPUT METHOD THEREFOR

(75) Inventors: Hyo-Joo Ahn, Seoul (KR); Nam-Jong Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/466,415

(22) Filed: Aug. 22, 2006

(65) Prior Publication Data

US 2007/0195633 A1     Aug. 23, 2007

(30) Foreign Application Priority Data

Feb. 21, 2006     (KR) .................. 10-2006-0016607

(51) Int. Cl.
 *G11C 8/00* (2006.01)
(52) U.S. Cl. .................. 365/230.05; 365/230.03; 365/230.02; 365/189.02
(58) Field of Classification Search ............ 365/189.02, 365/189.03, 201, 230.02, 230.03, 230.05; 711/102, 104
See application file for complete search history.

(56) References Cited

U.S. PATENT DOCUMENTS

| | | | | |
|---|---|---|---|---|
| 4,796,232 A | * | 1/1989 | House ................. | 365/189.03 |
| 4,967,398 A | * | 10/1990 | Jamoua et al. ......... | 365/230.05 |
| 5,239,509 A | * | 8/1993 | Ikawa et al. .............. | 365/201 |
| 5,276,842 A | * | 1/1994 | Sugita ..................... | 711/149 |
| 5,335,199 A | * | 8/1994 | Aoyama ............... | 365/230.05 |
| 5,502,683 A | * | 3/1996 | Marchioro ........... | 365/230.05 |
| 5,768,211 A | * | 6/1998 | Jones et al. ........... | 365/230.05 |
| 5,815,456 A | | 9/1998 | Rao | |
| 6,167,487 A | | 12/2000 | Camacho et al. | |
| 6,310,818 B1 | * | 10/2001 | Mukai .................. | 365/230.05 |
| 6,868,030 B2 | | 3/2005 | Okuyama et al. | |
| 2007/0022245 A1 | * | 1/2007 | Sohn et al. ................. | 711/106 |

* cited by examiner

*Primary Examiner*—Richard Elms
*Assistant Examiner*—Harry W Byrne
(74) *Attorney, Agent, or Firm*—Marger Johnson & McCollom, P.C.

(57) ABSTRACT

A multi-port semiconductor memory device and a signal input/output method therefore are provided. In one embodiment, the multi-port semiconductor memory device includes a plurality of different input/output ports and a memory array. The memory array has at least one memory region that is accessed by using different input/output ports. The different input/output ports include a first input/output port through which a first signal is input/output and a second input/output port through which a second signal different from the first signal is input/output. The memory region is divided into a plurality of memory regions. The invention provides effects of reducing the number of test pins and improving test efficiency.

29 Claims, 8 Drawing Sheets

MULTI-PORT SEMICONDUCTOR MEMORY DEVICE AND SIGNAL INPUT/OUTPUT METHOD THEREFOR

CROSS-REFERENCE TO RELATED PATENT APPLICATIONS

This application claims the benefit of Korean Patent Application No. 2006-16607, filed on Feb. 21, 2006, in the Korean Intellectual Property Office, this disclosure of which is incorporated by reference.

BACKGROUND

1. Field of the Invention

The present invention relates to multi-port semiconductor memory devices, and more particularly, to a multi-port semiconductor memory device and a signal input/output method thereof, in which different signal input/output ports are used depending on whether the device is being operated in a normal mode or a test mode.

2. Description of the Related Art

Most semiconductor memory devices, including RAM (Random Access Memory), have one input/output port having a plurality of input/output pin sets to communicate with an external processor.

FIG. 1 is a block diagram of a semiconductor memory device illustrating access paths according to conventional art, and in particular illustrates access paths in a conventional semiconductor memory device having four memory banks and a single input/output port.

As shown in FIG. 1, a conventional semiconductor memory device includes a memory array 10 having four memory banks 10a, 10b, 10c, and 10d, and a single input/output port 20. The input/output port 20 may be provided as an input/output path of command signals, address signals, data signals, and other signals, etc. between a semiconductor memory device and an external processor.

All of memory banks 10a, 10b, 10c, and 10d constituting the memory array 10 are configured to be accessed through the one input/output port 20. In FIG. 1, the arrows indicate access paths.

Such conventional semiconductor memory devices having one port have problems in terms of access speed or access efficiency. For example, in FIG. 1, in a case where first data is stored in A bank 10a in a first operation, and second data is read out from B bank 10b in a second operation different from the first operation, the operations must be performed at separate time intervals. That is, the first operation is performed and then the second operation is performed, or vice-versa, which requires an at least one additional time interval and precludes possible higher speed and higher efficiency operations.

In order to solve the problems, a multi-port semiconductor memory device was provided in U.S. Pat. No. 5,815,456 issued on Sep. 29, 1998 as an example of conventional multi-port semiconductor memory device, in which the communication was performed through a plurality of processors. Thus, in this multi-port semiconductor memory device, memory cells may be accessed through a plurality of input/output ports.

However, in this and other conventional respective multi-port semiconductor memory devices, access paths between input/output ports and memory regions, e.g., memory banks, are predetermined in hardware, thus making it difficult to vary the configuration thereof, such as varying configurations between a operation mode and a test mode to test the semiconductor memory device. In particular, when test pins of a test equipment are not present to test the semiconductor memory device, the test cannot be performed. Furthermore, even if the test pins are present, the access paths are predetermined, thus requiring a test to be separately performed through predetermined input/output ports, which may decrease the test efficiency.

SUMMARY

Some embodiments of the present invention provide a multi-port semiconductor memory device and a signal input/output method thereof, in which signal input/output ports can be selectively used based on a desired device mode, thus increasing testing efficiency. In these embodiments, an address signal and a data signal can be input and/or output through different input/output ports to access desired memory regions.

A semiconductor memory device according to some embodiments of the invention includes a plurality of different input/output ports and a memory array, which has at least one memory region that is accessed by using different input/output ports. In other words, the device may include a first input/output port through which a first signal is input/output and/or a second input/output port through which a second signal different from the first signal is input/output.

BRIEF DESCRIPTION OF THE DRAWINGS

The above and other features of exemplary embodiments of the invention will become readily apparent from the description that follows, with reference to the attached drawings, in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 8. This invention may, however, as mentioned above, be embodied in many different forms and should not be construed as being limited to the exemplary embodiments set forth herein; rather, these exemplary embodiments are provided so that this disclosure is thorough and complete, and conveys the concept of the invention to those skilled in the art.

The following description will provide only, for example, a multi-port semiconductor memory device having two input/output ports according to some embodiments of the invention, but it will be apparent to those skilled in the art that the invention may be applied to a multi-port semiconductor memory device having two or more input/output ports according to some embodiments of the invention.

A multi-port semiconductor memory device according to some embodiments of the invention may have different operations based on respective first and second modes. Embodiments therefor will be described referring to FIGS. 2 and 3, as follows.

Figure 1:
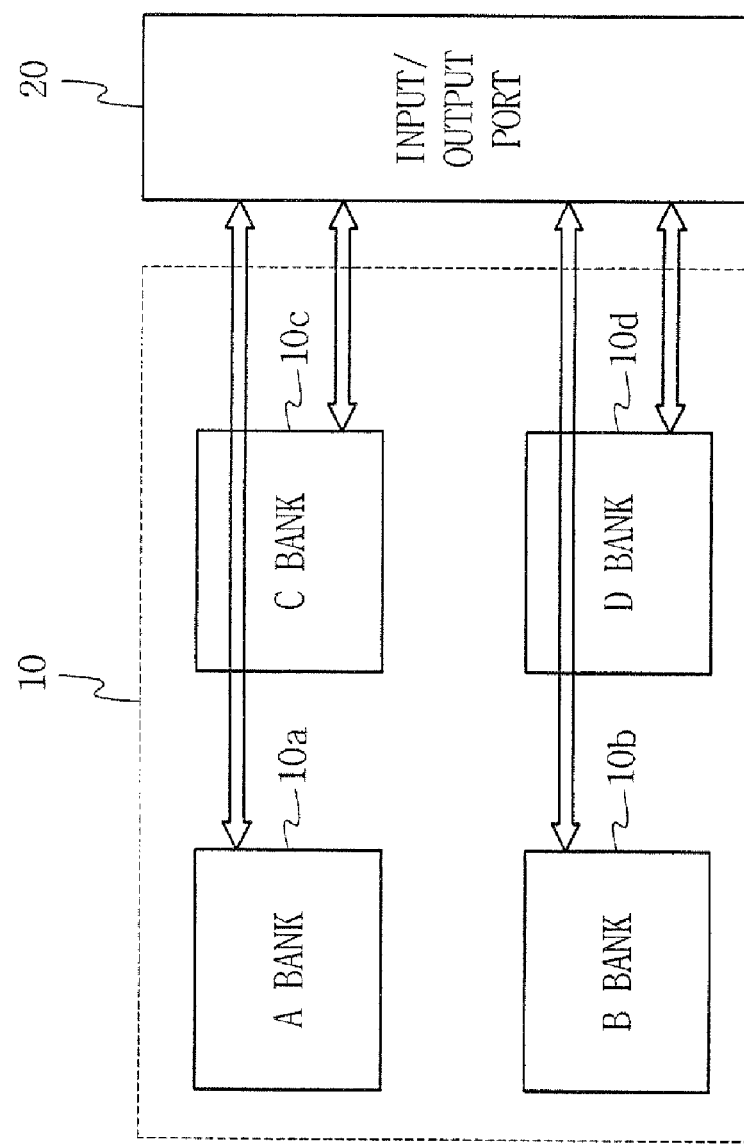
FIG. 1 is a block diagram of a semiconductor memory device illustrating access paths according to conventional art.
Figure 2:
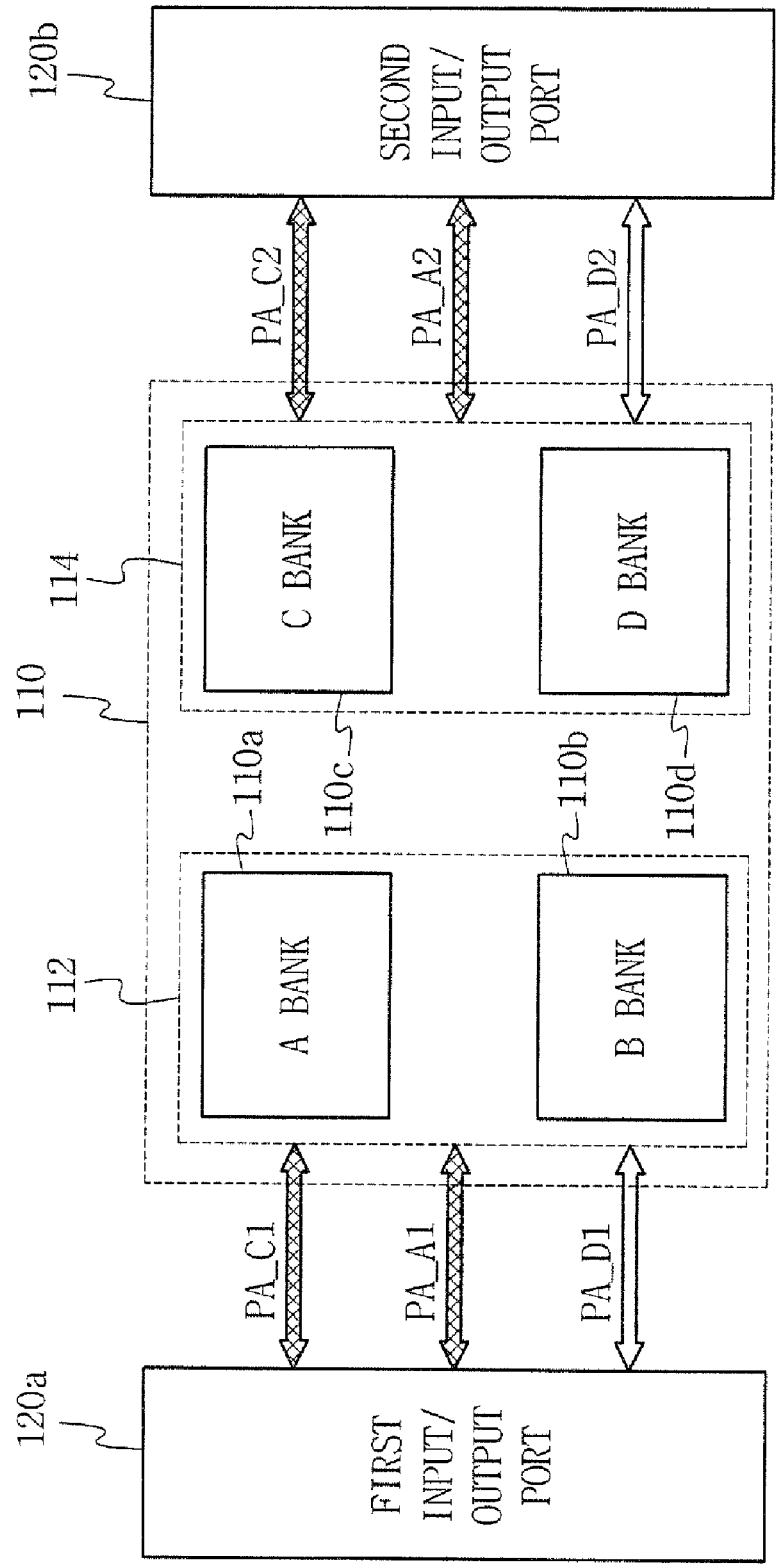
FIG. 2 is a block diagram of a semiconductor memory device illustrating access paths in a first mode according to an embodiment of the present invention.

FIG. 2 is a block diagram of a multi-port semiconductor memory device schematically illustrating access operations in a first mode according to an embodiment of the present invention. The first mode may herein indicate including a normal operating mode in a general semiconductor memory device. The normal operating mode may include operations of reading out data from memory cells of a semiconductor memory device or writing data into the memory cells.

As shown in FIG. 2, a multi-port semiconductor memory device according to some embodiments of the invention may include a memory array 110, a first input/output port 120a, and a second input/output port 120b.

The memory array 110 may be divided into a plurality of different memory regions. The memory array 110 illustrated in this embodiment is shown to be constructed with four memory banks 110a, 110b, 110c, and 110d. However, additional or fewer memory banks may be present. In a normal operating mode, referred to here as the first mode, an A bank 110a and a B bank 110b in a first memory region 112 from among the memory banks 110a, 110b, 110c, and 110d may be determined to be accessed only by signals input through the first input/output port 120a. A C bank 110c and a D bank 110d in a second memory region 114 may be determined to be accessed only by signals input through the second input/output port 120b.

Command signals input through the first input/output port 120a, for example, RAS (row strobe signal), CAS (column strobe signal), WE (write enable), are transferred to the interior of the semiconductor memory device, for example, a peripheral region, through a first command path PA_C1 disposed between the first memory region 112 and the first input/output port 120a. The command signals input through the first input/output port 120a may be signals to read out data stored in the first memory region 112 or write data therein or for other control. Address signals input through the first input/output port 120a are transferred to the interior of the semiconductor memory device, for example, a peripheral region, through a first address path PA_A1 disposed between the first memory region 112 and the first input/output port 120a to select a memory cell from the first memory region 112. Data input through the first input/output port 120a is stored in a memory cell within the first memory region 112 through first data path PA_D1. Similarly, data stored in a memory cell within the first memory region 112 is output through the first data path PA_D1 and the first input/output port 120a.

Further, operations for command signals, address signals, and data input/output through the second input/output port 120b are carried out in a similar manner. That is, command signals input through the second input/output port 120b are transferred to the interior of the semiconductor memory device, for example, a peripheral region, through a second command path PA_C2 disposed between the second memory region 114 and the second input/output port 120b. The command signals input through the second input/output port 120b may be signals to read out data stored in the second memory region 114 or write data therein or for other control.

Address signals input through the second input/output port 120b are transferred to the interior of the semiconductor memory device, for example, a peripheral region, through a second address path PA_A2 disposed between the second memory region 114 and the second input/output port 120b, to select a memory cell from the second memory region 114.

Data input through the second input/output port 120b is stored in a memory cell within the second memory region 114 through a second data path PA_D2. Similarly, data stored in a memory cell within the second memory region 114 is output through the second data path PA_D2 and the second input/output port 120b.

Therefore, in the first mode, signals to access to the first memory region 112 are input/output only through the first input/output port 120a, and signals to access to the second memory region 114 are input/output only through the second input/output port 120b. In the first mode, the second address path PA_A2, second command path PA_C2, and second data path PA_D2 to access to the second memory region 114 share the same input/output port, the second input/output port 120b.

In other embodiments, only one bank of the memory banks 110a, 110b, 110c, and 110d may be accessed through the first input/output port 120a, and the rest of the banks may then be accessed through the second input/output port 120b. Further, in still other embodiments, the memory region may uniformly include memory banks 110a, 110b, 110c, and 110d, where all the memory banks are accessed only through the first input/output port 120a, all the memory banks are accessed only through the second input/output port 120b, or even where the memory region is a shared memory region that is accessible simultaneously through the first and second input/output ports 120a and 120b. Thus, as is apparent to those skilled in the art, operations in the first mode may be varied in many forms without departing from the scope of the present invention.

Though not shown in the drawings, the semiconductor memory device may include control circuits, for example, a buffer circuit, a decoder circuit, a register circuit, a multiplexer circuit, a sense amplifier, etc., to control command signals, address signals, data signals and other signals, etc. input/output through the first input/output port 120a and/or the second input/output port 120b, such as those in a typical semiconductor memory device.

Figure 3:
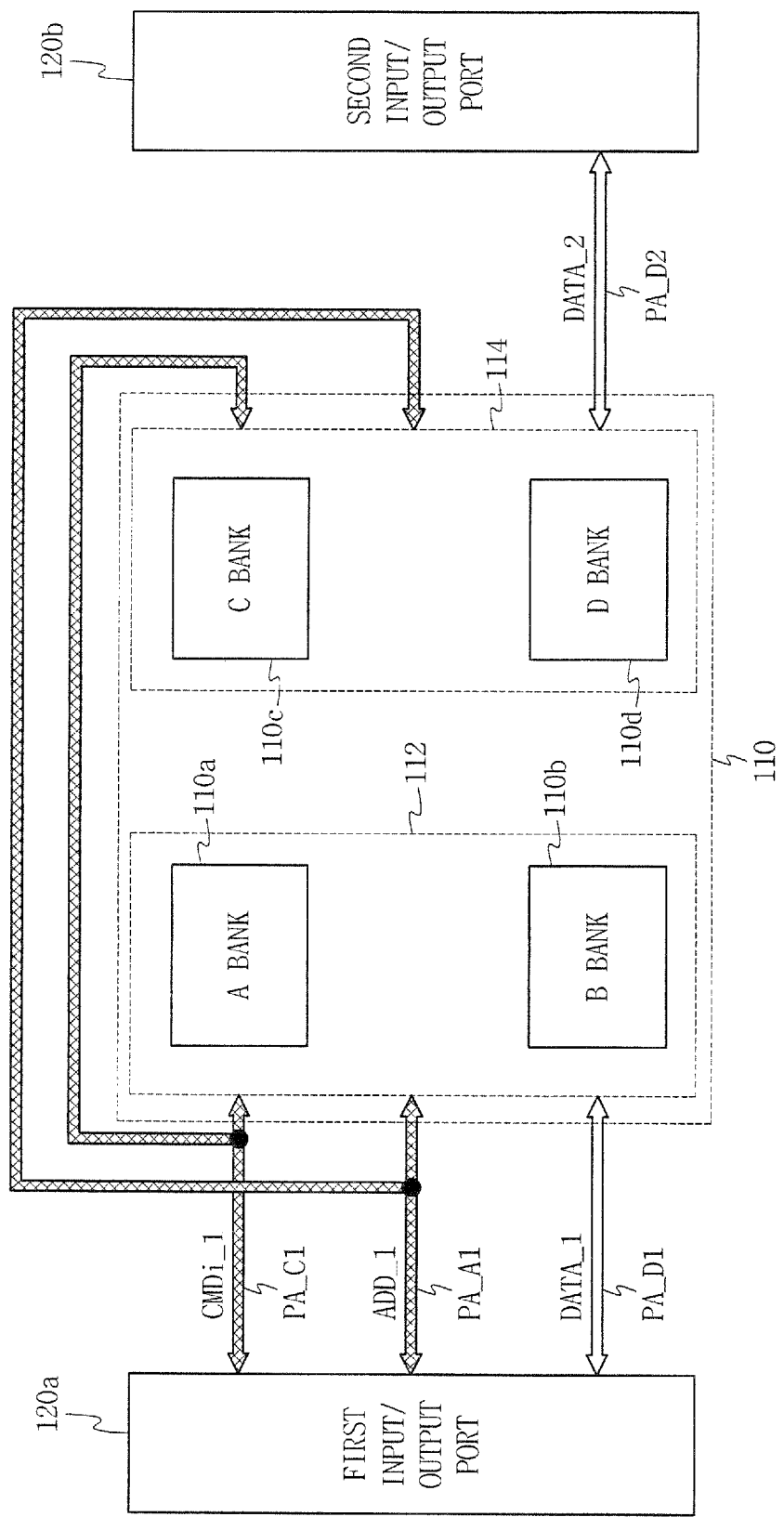
FIG. 3 is a block diagram of a semiconductor memory device illustrating access paths in a second mode according to another embodiment of the present invention.

FIG. 3 is a block diagram of a multi-port semiconductor memory device schematically illustrating an example of access operation in a second mode according to another embodiment of the present invention. The second mode may herein include a test operating mode applied to a general semiconductor memory device. The test operating mode may be to test circuits including memory cells in order to check for defects in the semiconductor memory devices.

As shown in FIG. 3, in the second mode, an A bank 110a and a B bank 110b in a first memory region 112 from among the memory banks 110a, 110b, 110c, and 110d may be accessed only by signals input through the first input/output port 120a. A C bank 110c and a D bank 110d in a second memory region 114 may be accessed by signals input through the first and second input/output ports 120a and 120b.

For example, command signals CMDi_1 and address signals ADD_1 are all input through the first input/output port 120a, and are provided to the interior of semiconductor memory device through the first command path PA_C1 and the first address path PA_A1. The command signals CMDi_1 and the address signals ADD_1 may include command signals and address signals to access to the first memory region 112 and the second memory region 114. It may be also possible to input all of command signals CMDi_1 and address signals ADD_1 through the second input/output port 120b.

However, for data, access paths are similarly arranged to those in the first mode of operation. In other words, to write data to a memory cell within the first memory region 112, data DATA_1 input through the first input/output port 120a is input through the first data path PA_D1, and data DATA_1 stored at a memory cell within the first memory region 112 is output through the first data path PA_D1 and the first input/output port 120a. Further, data DATA_2 input through the second input/output port 120b is stored at a memory cell within the second memory region 114 through the second data path PA_D2, and the data DATA_2 stored at the memory cell within the second memory region 114 is output through the second data path PA_D2 and the second input/output port 120b.

That is, in the second mode, address signals ADD_1 and command signals CMDi_1 to access the first and second memory regions 112 and 114 are input/output only through the first input/output port 120a, while the DATA_1 based on read and write operation of the first memory region 112, and the data DATA_2 based on the read and write operation of the second memory region 114 are respectively input/output through the first and second input/output port 120a and 120b.

Thus, in the second mode, a first input/output port may be used to provide control and address signals to a particular memory region (in this embodiment, the second memory region 114), while a separate second input/output port may be used to input/output data to the particular memory region.

In the second mode, testing efficiency of a test operation may be improved as compared to the conventional art. As described above, in the conventional art, testing may be performed in a signal arrangement similar to that provided for in a normal operation mode. In this case, test pins in a test equipment must be provided for both input/output ports and an increased test time may be needed to operate a complete testing procedure. However, according to some embodiments of the present invention, address and command signals can be inputted through one input/output port, while data is input/output through separate port data lines. This, in turn, may reduce the number of required test pins and additionally increase the performance efficiency of the testing procedures. In some embodiments comprehended by the present invention, it may be possible to configure the semiconductor memory device so as to prevent problems resulting from defects in an input/output port that is not checked.

Examples of the semiconductor memory device will now be described according to some embodiments of the invention, in which a first mode refers to a normal operating mode and a second mode refers to a test operating mode.

However, according to further embodiments of the invention, the second mode may not be limited to a test operating mode, but may include other specific normal operating mode. In other words, in a specific mode, all address signals and/or command signals to access all memory regions may be input/output, thereby sharing one input/output port of the input/output ports, while data signals input/output in response to the address signals and/or command signals may be input/output through different input/output ports. In addition, a semiconductor memory device that operates with the second mode as a normal operating mode without the first mode, may be provided as another embodiment. That is, the semiconductor memory device may include a memory array, which has at least one memory region accessed through different input/output ports through each of which a first signal is input/output and a second signal different from the first signal is input/output, and which is divided into a plurality of memory regions. The first signal may herein include an address and/or command signal, and the second signal may indicate a data signal.

Figure 4:
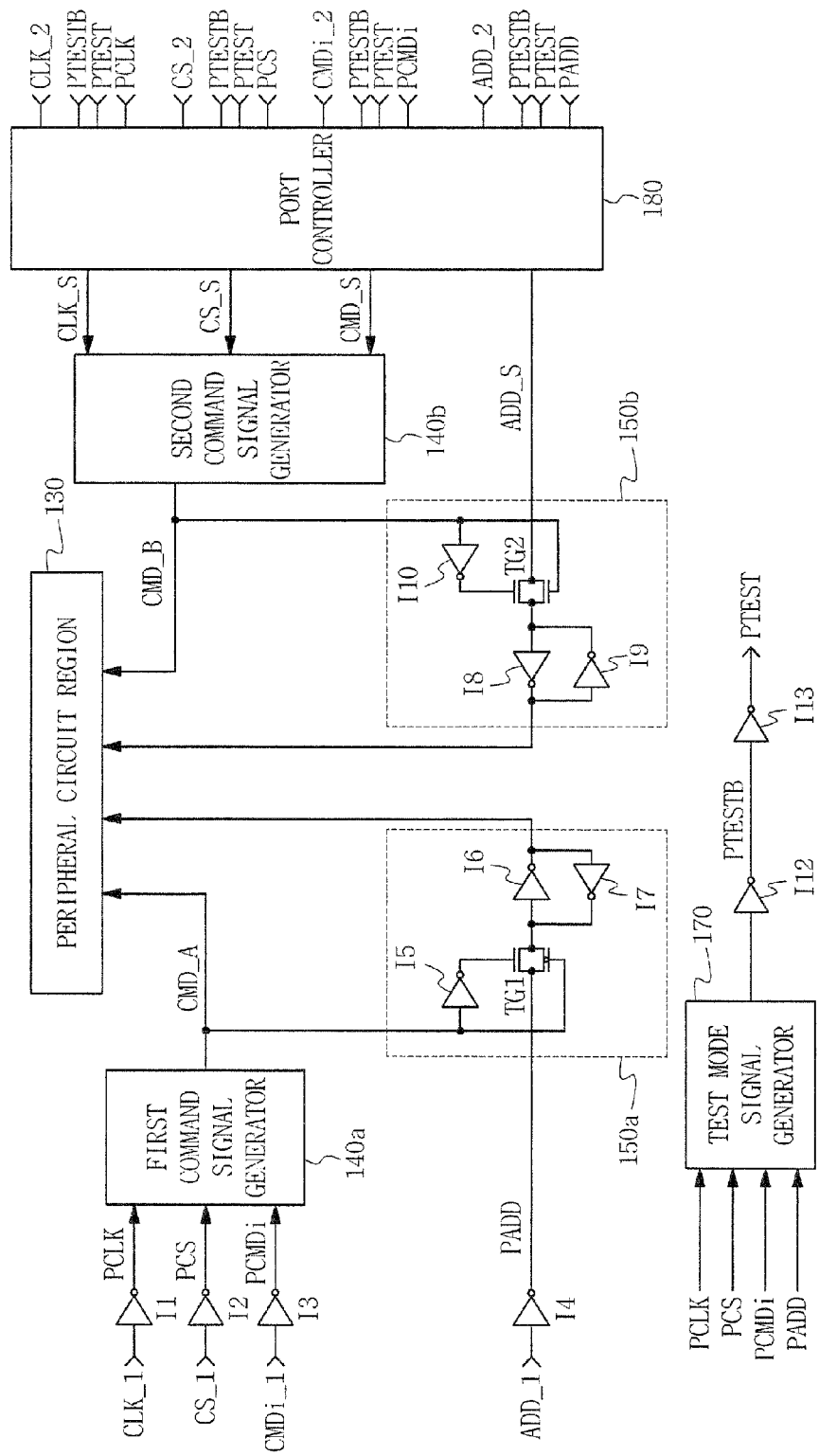
FIG. 4 illustrates an example of semiconductor memory device with access paths illustrated in FIGS. 2 and 3.

FIG. 4 is a circuit diagram of semiconductor memory device to perform operations illustrated in FIGS. 2 and 3 according to some embodiments of the present invention. Data input/output operations thereof are similar to the conventional art like the examples described above, and thus will be omitted in the following description. In other words, because the data transfer operations may be similar to conventional techniques, this description will focus on operations using input/output ports relating to address signals and command signals in different modes. Thus, only input paths of the address signals and command signals are shown in the following drawing. Also, for example, address signals and command signals are herein input to control circuits within a peripheral circuit region 130, e.g., an address decoder circuit, a command decoder circuit, etc., the control circuits constituting a typical semiconductor memory device.

In FIG. 4, a clock signal CLK_1, a chip enable signal CS_1, a command signal CMDi_1, and an address signal ADD_1 are input through first input/output port 120a, and a clock signal CLK_2, a chip enable signal CS_2, a command signal CMDi_2, and an address signal ADD_2 are input through second input/output port 120b. Further, the clock signal CLK_1, the chip enable signal CS_1, the command signal CMDi_1, and the address signal ADD_1 may be to access the first memory region 112 or the second memory region 114, and the clock signal CLK_2, the chip enable signal CS_2, the command signal CMDi_2, and the address signal ADD_2 may be to access only to the second memory region 114.

As shown in FIG. 4, a semiconductor memory device according to some embodiments of the invention includes a peripheral region 130, a first command signal generator 140a, a second command signal generator 140b, a port controller 180, a test mode signal generator 170, and address synchronizing circuits 150a and 150b.

The peripheral circuit region 130 provided herein may be a peripheral region provided in classifying a typical semiconductor memory device into a memory array region, a core region, and a peripheral region. All of the first command signal generator 140a, the second command signal generator 140b, the port controller 180, the test mode signal generator 170, and the address synchronizing circuits 150a and 150b shown in FIG. 4 may be included in the peripheral region; however, respective parts are illustrated separately in the drawings in order to demonstrate characteristics of the embodiments of the present invention.

The first command signal generator 140a combines command signals PCMDi input through the first input/output port 120a and inverted by an inverter circuit 13, and then synchronizes them to a clock signal CLK_1 input through the first input/output port to output a command signal CMD_A, which may be used to access the first memory region 112. The first command signal generator 140a will be described in more detail in FIG. 6.

The second command signal generator 140b combines command signals CMD_S input through the first input/output port 120a or the second input/output port 120b and selected by the port controller 180, and then synchronizes them to a clock signal CLK_S selected by the port controller 180 from the clock signal CLK_1 input through the first input/output port 120a or the clock signal CLK_2 input through the second input/output port 120b to output a command signal CMD_B, which may be used to access the second memory region 114. The second command signal generator 140b will be described in more detail in FIG. 7.

The port controller 180 selects a command signal PCMDi and an address signal PADD input through the first input/output port 120a, or a command signal CMDi_2 and an address signal ADD_2 input through the second input/output port 120b depending on a mode of operation to access the second memory region 114. For example, in a first mode, command signal PCMDi and address signal PADD input through the first input/output port 120a may be selected, and the command signal PCMDi is transmitted to the second command signal generator 140b, and the address signal PADD is transmitted to the address synchronizing circuit 150b. In the second mode, however, a command signal CMDi_2 and an address signal ADD_2 input through the second input/output port 120b may be selected, and the command signal CMDi_2 is transmitted to the second command signal generator 140b, and the address signal ADD_2 is transmitted to the address synchronizing circuit 150b. The port controller 180 selects a clock signal PCLK and a chip enable signal PCS input through the first input/output port 120a or a clock signal CLK_2 and a chip enable signal CS_2 input through the second input/output port 120b depending on a mode of operation, and then transmits them to the second command signal generator 140b. The configuration and operations for the port controller 180 will be described in more detail in FIG. 5.

The test mode signal generator 170 combines a clock signal CLK_1, a chip enable signal CS_1, a command signal CMDi_1, and inverted signals PCLK, PCS, PCMDi, and PADD of an address signal ADD_1, which are input through the first input/output port 120a to generate a disable signal PTESTB of a test mode as a second mode and a test mode enable signal PTEST. For example, herein the test mode enable signal PTEST may have a logic high level in enabling the test mode, and may have a logic low level in disabling the test mode. Further, the test mode disable signal PTESTB may be an inverted signal of the test mode enable signal PTEST, and may be called a normal operating mode enable signal. Circuits enabled by a test mode enable signal to perform a test mode may be provided as circuits well known to those skilled in the art.

The address synchronizing circuits 150a and 150b respectively synchronize applied-address signal PADD and ADD_S with applied-command signal CMD_A and CMD_B, and then outputs the respective synchronized address signals.

For example, the address signal PADD to access to the first memory region 112 may be synchronized with the command signal CMD_A generated in the first command signal generator 140a before being transmitted to the peripheral circuit region 130, where the address signal is latched and synchronized using the address synchronizing circuit 150a including inverters 15, 16, and 17 and a transmission gate TG1.

Figure 5:
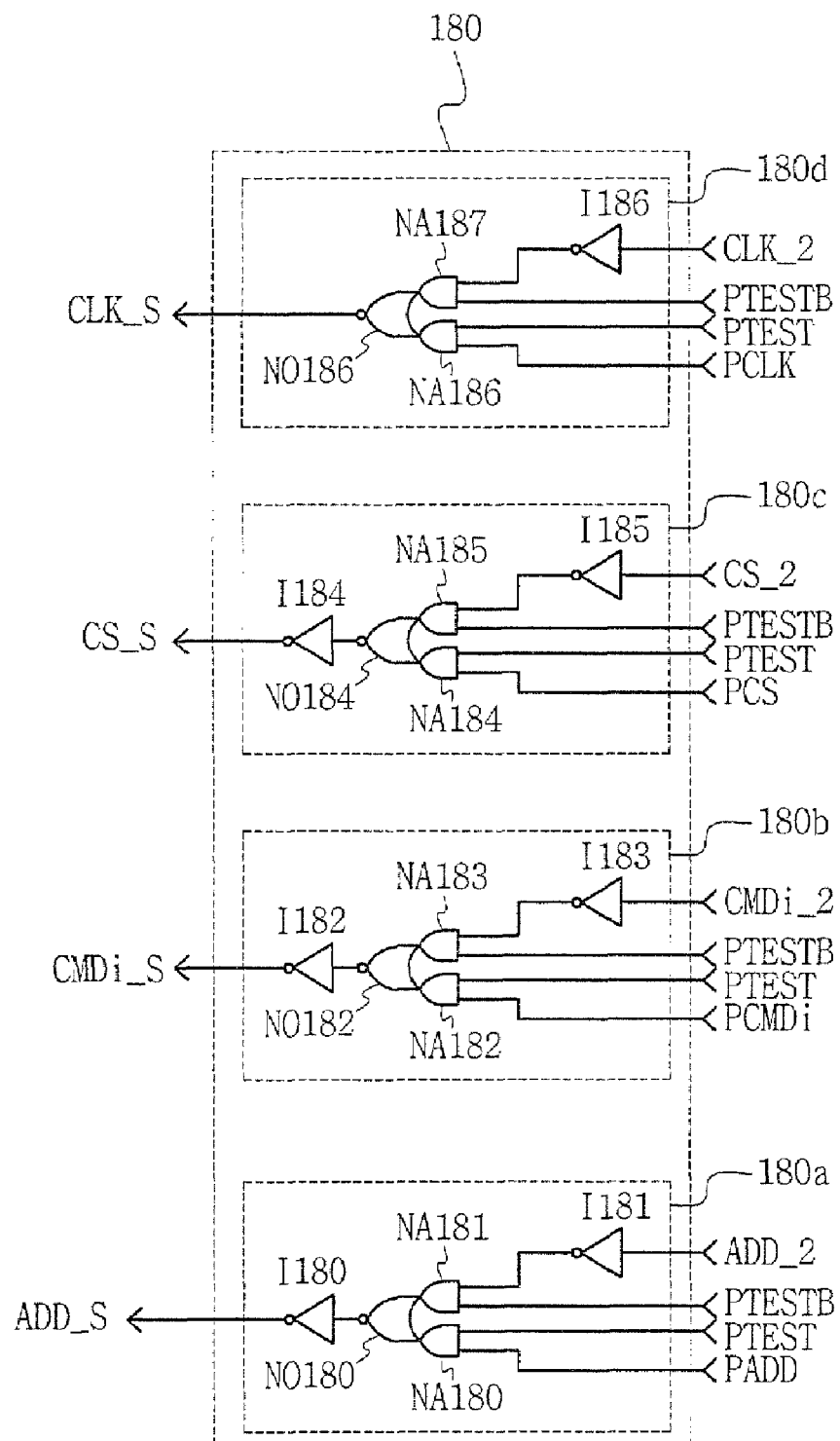
FIG. 5 illustrates an example of port controller shown in FIG. 4.

FIG. 5 illustrates an example of port controller 180 shown in FIG. 4.

As shown in FIG. 5, the port controller 180 includes a clock signal selector 180d, a chip enable signal selector 180c, a command signal selector 180b, and an address signal selector 180a.

The clock signal selector 180d includes a NOR circuit NO186, NAND circuits NA186 and NA187, and an inverter circuit I186, with a connected structure shown in FIG. 5. The chip enable signal selector 180c includes a NOR circuit NO184, NAND circuits NA184 and NA185, and inverter circuits I184 and I185. The command signal selector 180b includes a NOR circuit NO182, NAND circuits NA182 and NA183, and inverter circuits I182 and I183. The address signal selector 180a includes a NOR circuit NO180, NAND circuits NA180 and NA181, and inverter circuits I180 and I181. Connection configurations of these logic circuits may have the structure shown in FIG. 5.

In a normal operating mode, such as a first mode, the clock signal selector 180d, the chip enable signal selector 180c, the command signal selector 180b, and the address signal selector 180a operate as follows.

For example, when the clock signals CLK_1 and CLK_2 have a high level, the signals may be enabled, and when the command signals CMDi_1 and CMDi_2 and the chip enable signals CS_1 and CS_2 have a low level, the signals may be enabled. In such an example, the chip enable signals CS_1 and CS_2 may operate as enable signals to enable the first and second command signal generators 140a and 140b.

When the test mode enable signal PTEST is input as a low level and the test mode disable signal PTESTB is input as a high level, such as in the case for a normal operating mode as a first mode, the clock signal selector 180d, the chip enable signal selector 180c, the command signal selector 180b, and the address signal selector 180a operate as follows.

The clock signal selector 180d selects a clock signal CLK_2 input through the second input/output port 120b, and outputs it as a clock signal CLK_S to be input to the second command signal generator 140b. The chip enable signal selector 180c selects a chip enable signal CS_2 input through the second input/output port 120b, and outputs it as a chip enable signal CS_S to be input to the second command signal generator 140b. The command signal selector 180b selects a command signal CMDi_2 input through the second input/output port 120b, and outputs it as a command signal CMDi_S to be input to the second command signal generator 140b. The address signal selector 180a selects an address signal ADD_2 input through the second input/output port 120b, and outputs it as an address signal ADD_S to be input to the second command signal generator 140b.

When the test mode enable signal PTEST is input as a high level and the test mode disable signal PTESTB is input as a low level, such as in the case for a test operating mode as a second mode, the clock signal selector 180d, the chip enable signal selector 180c, the command signal selector 180b, and the address signal selector 180a operate as follows.

The clock signal selector 180d selects a clock signal PCLK input through the first input/output port 120a, and outputs it as a clock signal CLK_S to be input to the second command signal generator 140b. The chip enable signal selector 180c selects a chip enable signal PCS input through the first input/output port 120a, and outputs it as a chip enable signal CS_S to be input to the second command signal generator 140b. The command signal selector 180b selects a command signal PCMDi input through the first input/output port 120a, and outputs it as a command signal CMDi_S to be input to the second command signal generator 140b. The address signal selector 180a selects an address signal PADD input through the first input/output port 120a, and outputs it as an address signal ADD_S to be input to the second command signal generator 140b.

Figure 6:
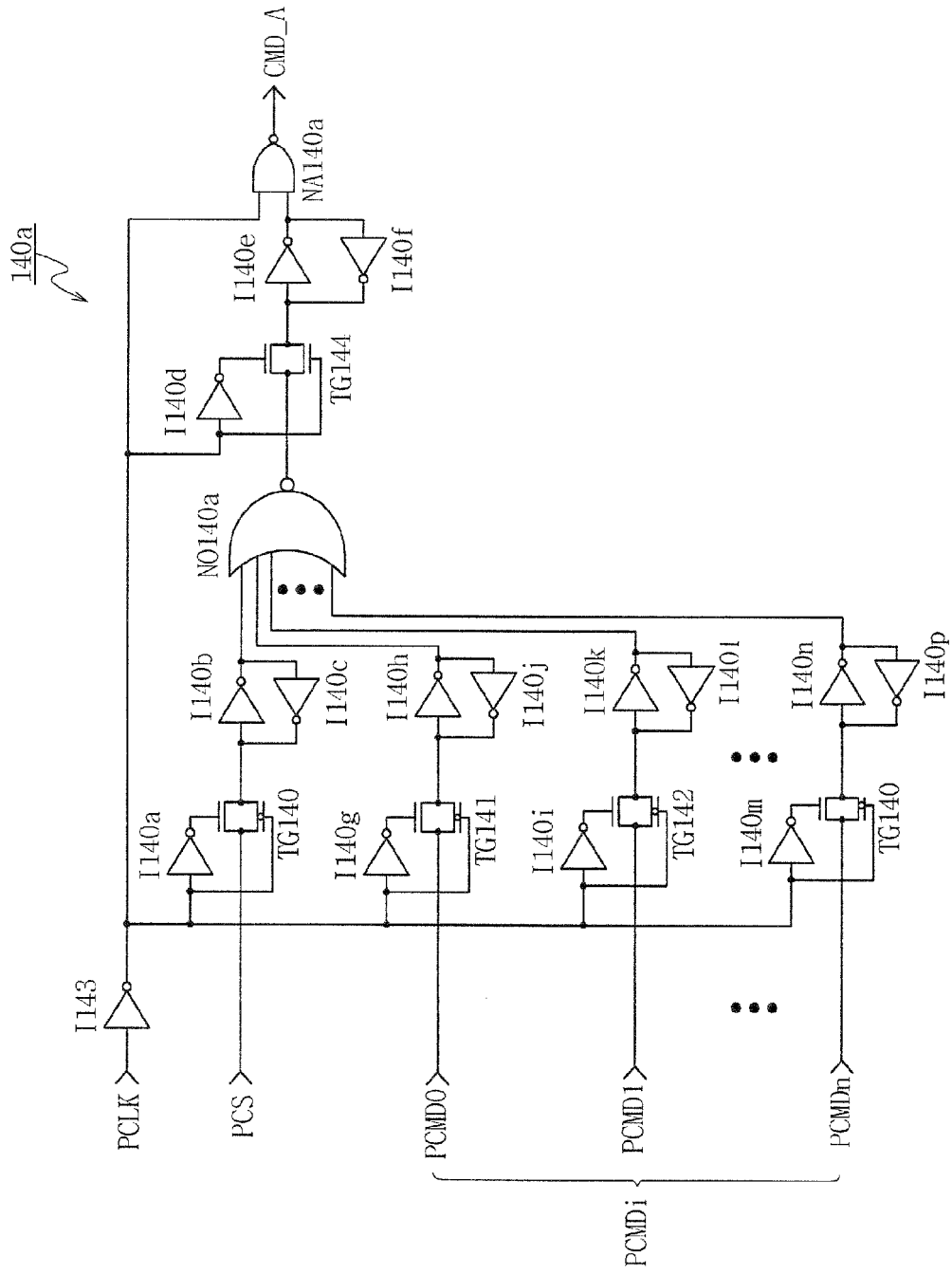
FIGS. 6 and 7 illustrate examples of first and second command signal generators shown in FIG. 4.

FIG. 6 illustrates an embodiment of the first command signal generator 140a.

The first command signal generator 140a includes inverters I140a, I140b, I140c, I140d, I140e, I140f, I140g, I140h, I140i, I140j, I140k, I140l, I140m, I140n, I140p, and I143, transfer gates TG140, TG141, TG142, TG143, and TG144, a NOR circuit NO140a, and a NAND circuit NA140a, with a connected structure shown in FIG. 6.

As shown in FIG. 6, the first command signal generator 140a combines applied-command signals PCMD0, PCMD1, and PCMDn, and outputs a command signal CMD_A after synchronizing the input signals to a clock signal PCLK. The command signals PCMD0, PCMD1, and PCMDn may include command signals RASB, CASB, and WEB used in a typical semiconductor memory device.

The first command signal generator 140a receives an inverted clock signal PCLK of a clock signal CLK_1 input through the first input/output port 120a. The transfer gates TG140, TG141, TG142, TG143, and TG144 operate by a buffered signal of the clock signal CLK_1, and inverted signal PCS of chip enable signal CS_1 and an inverted command signal PCMDi of command signal CMDi_1 are transmitted by operation of the transfer gates TG140, TG141, TG142, TG143, and TG144. The inverted signal PCS of chip enable signal CS_1 and the inverted command signal PCMDi of the command signal CMDi_1 transmitted by operation of the transfer gates TG140, TG141, TG142, TG143, and TG144 are latched and inverted by a latch circuit constructed of two inverter circuits, and are input to a NOR circuit NO140a. The NOR circuit NO140a performs a logical operation for the signals and outputs an output signal through a transfer gate TG144, which is then latched and inverted by a latch circuit constructed of inverters I140e and I140f before being input to the NAND circuit NA140A. The NAND circuit NA140a performs a logical operation for a signal applied through the latch circuit and a buffered signal of the clock signal CLK_1 and outputs a command signal CMD_A to be supplied to the peripheral circuit region 130.

Figure 7:
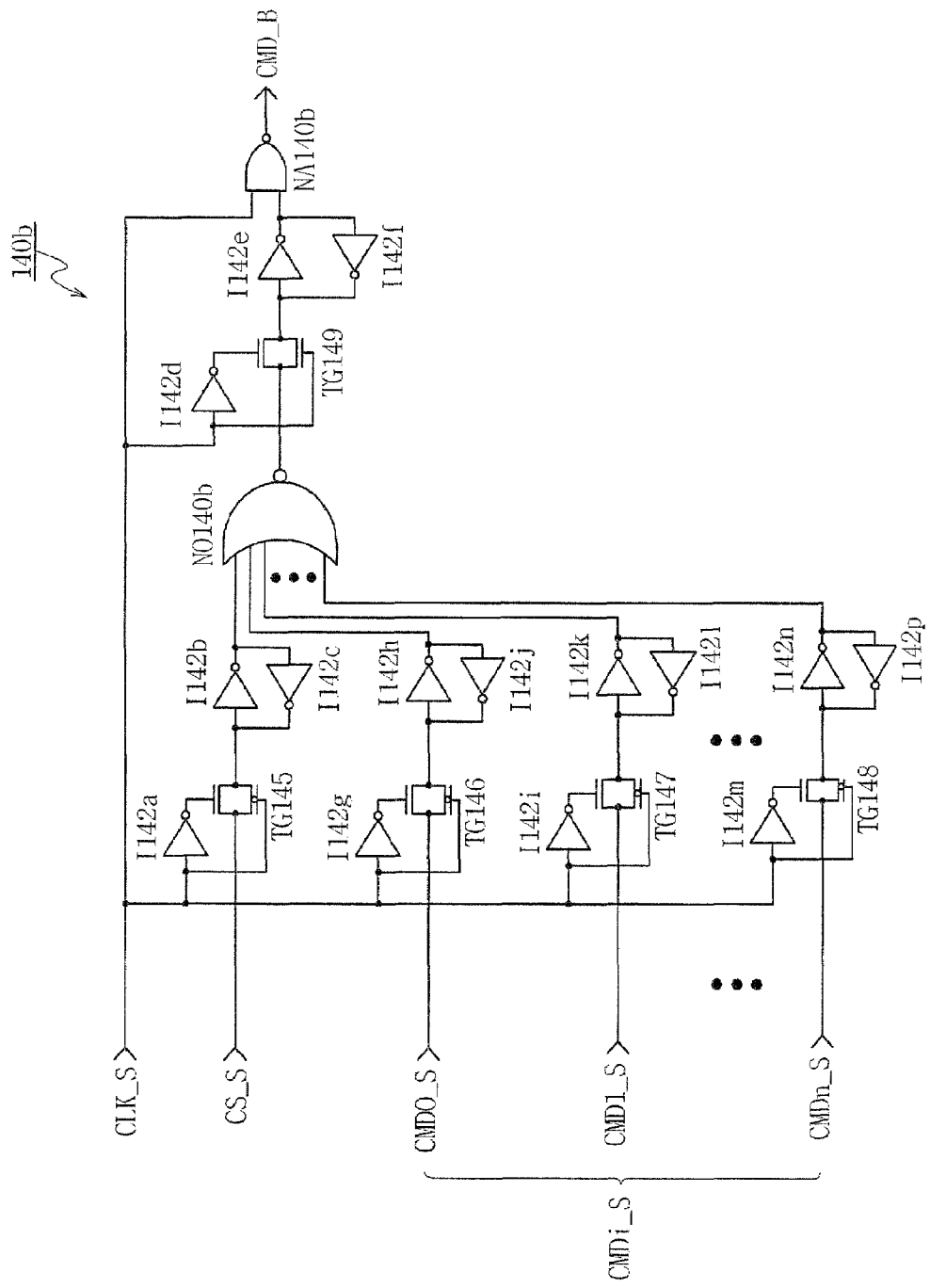

FIG. 7 illustrates an embodiment of the second command signal generator 140b.

The second command signal generator 140b includes inverters I142a, I142b, I142c, I142d, I142e, I142f, I142g, I142h, I142i, I142j, I142k, I142l, I142m, I142n, and I142p, transfer gates TG145, TG146, TG147, TG148, and TG149, a NOR circuit NO140b, and a NAND circuit NA140b, with a connected structure shown in FIG. 7.

As shown in FIG. 7, the second command signal generator 140b has a similar configuration to the configuration of the first command signal generator 130 shown in FIG. 6, except for the configuration of the inverter circuit I143. Operation of the second command signal generator 140b is similar to the signal generator 140a illustrated in FIG. 5, and thus further description of the operation of the second command signal generator 140b therefor will be omitted.

Figure 8:
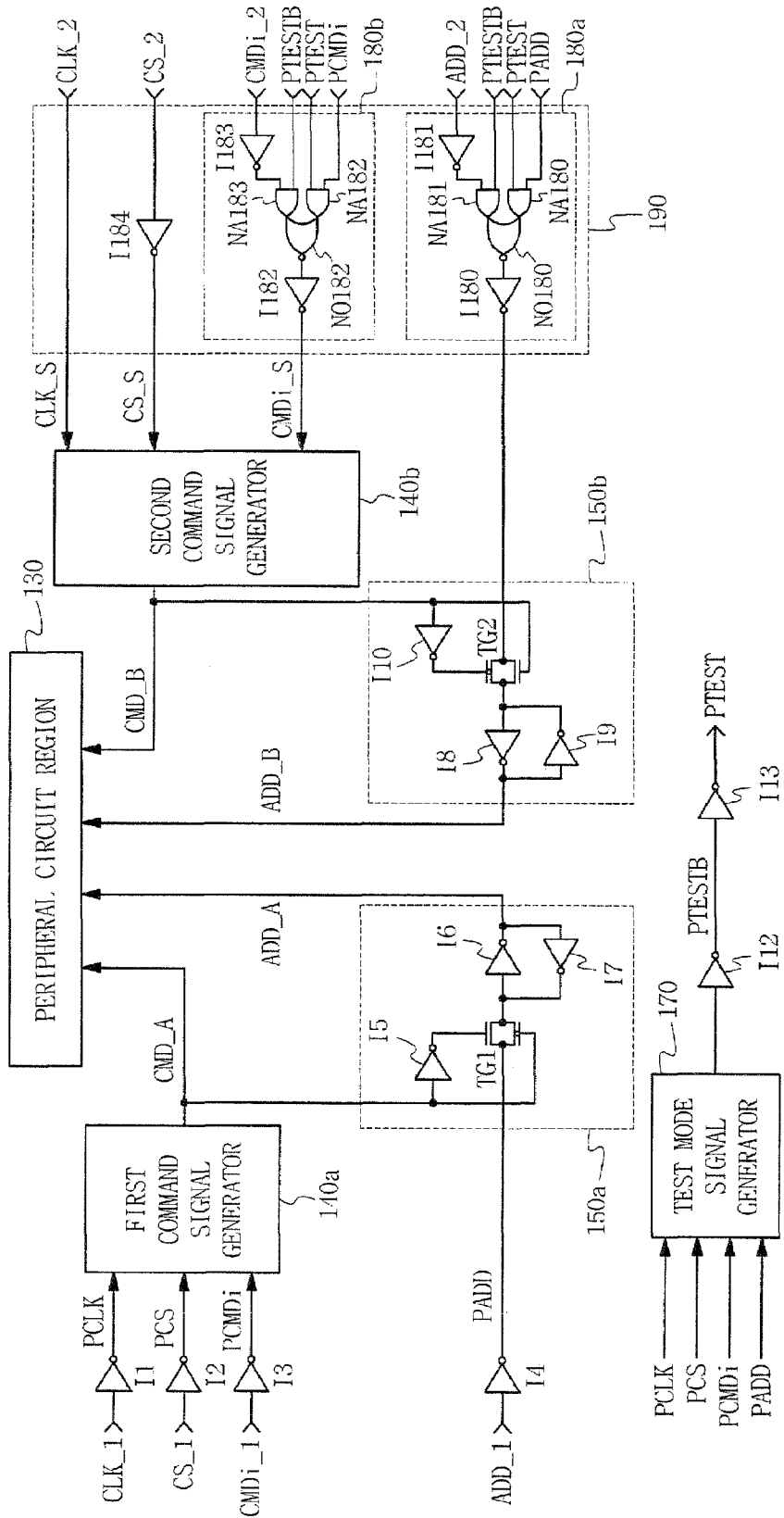
FIG. 8 illustrates an example of semiconductor memory device with access paths shown in FIGS. 2 and 3 according to a yet another embodiment.

FIG. 8 illustrates an example of semiconductor memory device to perform operations shown in FIGS. 2 and 3 according to still another embodiment of the present invention.

As shown in FIG. 8, a semiconductor memory device according to this additional embodiment has the same configuration as FIG. 4, except the configuration of a port controller 190. Therefore, only the port controller 190 will be further described. In the port controller 190, the configuration of the command signal selector 180b and the address signal selector 180a is also similar to the port controller illustrated in FIG. 5. However, the port controller 190 does not include a specific clock signal selector, such that clock signal CLK_2 input through the second input/output port 120b is supplied as the input clock signal CLK_S to the second command signal generator 140b. Further, the port controller 190 does not include a specific chip enable signal selector, such that chip enable signal CS_2 input through the second input/output port 120b is only inverted through inverter circuit I184, and is then supplied as the chip enable signal CS_S input to the second command signal generator 140b.

In the embodiment illustrated in FIG. 8, it may be relatively advantageous to select a specific memory region and perform a test. That is, to separately test only a second memory region 114, a clock signal CLK_2 and a chip enable signal CS_2 may be applied through the second input/output port 120b, while to separately test only a first memory region 112, a clock signal CLK_1 and a chip enable signal CS_1 may be applied through the first input/output port 120a. Further, in simultaneously performing the test of the first memory region 112 and the second memory region 114, clock signal CLK_1 and chip enable signal CS_1 may be applied through the first input/output port 120a, while clock signal CLK_2 and chip enable signal CS_2 may be applied through the second input/output port 120b.

As described above, in a multi-port semiconductor memory device according to some embodiments of the invention, address signals and command signals may be input, sharing one input/output port, and an input/output of data therefor may be provided through several input/output ports to thereby reduce the number of required test pins reduce test time.

Also, according to some embodiments of the invention, different input/output ports of address signals, command signals, etc. are provided, thus increasing an efficiency of test. That is, a normal operation may be performed in a first mode, and a secondary operation may be performed in a second mode since an address signal and a command signal, etc. share one input/output port.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, the internal configuration of circuits may be changed, or internal elements of circuits may be replaced with other equivalent elements. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device, comprising:
a plurality of input/output ports including a first input/output port and a second input/output port; and
a memory array including a plurality of memory regions comprising a first memory region and a second memory region each having a plurality of memory banks, wherein the first memory region and the second memory region are accessed by using only the first input/output port as a shared port first mode, where a first signal is input/output to the first memory region and the second memory region from the first input/output port and where a second signal different from the first signal is input/output to each of the first memory region and second memory region from each of the first input/output port and the second input/output port, and wherein the first memory region is accessed by using the first input/output port in a second mode, where the first signal is input/output to the first memory region only from the first input/output port and where the second signal is input/output to each of the first memory region and the second memory region from the first input/output port.

2. The device of claim 1, wherein the first signal is an address and/or command signal, and the second signal is a data signal.

3. The device of claim 2, wherein the semiconductor memory device is a dual port semiconductor memory device having a first input/output port and a second input/output port different from the first input/output port.

4. The device of claim 3, wherein the memory array includes a first memory region and a second memory region, the first memory region being accessed according to an address signal, a command signal, and data input/output through the first input/output port in the first and second modes, and the second memory region being accessed in the first mode according to an address signal, a command signal, and data input/output through the second input/output port, and/or in the second mode according to the address signal and the command signal input through the first input/output port and data input/output through the second input/output port.

5. The device of claim 4, wherein the first mode is a normal operating mode, and the second mode is a test operating mode.

6. The device of claim 4, wherein to access to the first memory region in the first mode and/or second mode, the address signals and the command signals input through the first input/output port synchronize to a clock signal input through the first input/output port.

7. The device of claim 6, wherein to access to the second memory region, the address signal and the command signal input through the second input/output port synchronize to a clock signal input through the second input/output port in the first mode, and in the second mode, an address signal and a command signal input through the first input/output port synchronize to a clock signal input through the first input/output port.

8. The device of claim 6, wherein to access to the second memory region, the address signal and the command signal input through the second input/output port synchronize to a clock signal input through the second input/output port in the first mode, and in the second mode, the address signal and the command signal input through the first input/output port synchronize to a clock signal input through the second input/output port.

9. A semiconductor memory device, comprising:
a plurality of different input/output ports including a first input/output Port and a second input/output port;
a memory array including a first memory region and a second memory region; and
a port controller for performing control so that in a specific mode, all address signals and/or command signals to access the first and second memory regions are input/output through only the first input/output port as a shared port, and data signals input/output in response to the address signals and/or command signals are input/output to the first memory region and the second memory region through each of the first and second input/output ports.

10. The device of claim 9, wherein from among the data signals, data signals for a read or write within the same memory region are input/output through the same input/output port.

11. The device of claim 10, wherein the specific mode is a test operating mode.

12. The device of claim 11, wherein the semiconductor memory device is a dual port semiconductor memory device having a first input/output port and a second input/output port different from the first input/output port.

13. The device of claim 12, wherein the memory array includes a first memory region and a second memory region, and in a test mode, the first memory region is accessed according to an address signal, a command signal, and data input/output through the first input/output port, and wherein the second memory region is accessed according to an address signal and a command signal input through the first input/output port, and data input/output through the second input/output port.

14. The device of claim 13, wherein to access the first memory region, the address signals and the command signals input through the first input/output port synchronize to a clock signal input through the first input/output port.

15. The device of claim 14, wherein to access the second memory region, the address signal and the command signal input through the first input/output port synchronize to a clock signal input through the first input/output port.

16. The device of claim 15, wherein to access the second memory region, the address signal and the command signal input through the first input/output port synchronize to a clock signal input through the second input/output port.

17. A method of inputting/outputting signals in a dual port semiconductor memory device including a plurality of memory regions, a first input/output port, and a second input/output port, the method comprising:
selecting a specific memory region from among the plurality of memory regions; and
inputting/outputting signals to access the specific memory region through the second input/output port in a first mode, and inputting/outputting the signals through the first input/output port in a second mode.

18. The method of claim 17, wherein the first mode is a normal operating mode, and the second mode is a test operating mode.

19. The method of claim 17, wherein the signals include address signals and/or command signals, and the signals synchronize to a clock signal input through the first input/output port.

20. The method of claim 17, wherein the signals include address signals and/or command signals, and the signals synchronize to a clock signal input through the second input/output port.

21. A semiconductor memory device comprising:
a first input/output port;
a second input/output port; and
a memory array including a first memory region and a second memory region, where the first memory region is accessed through the first input/output port with first and second signals in a first mode of operation and in a second mode of operation, and where the second memory region is accessed through the second input/output port with third and fourth signals in the first mode of operation and accessed through the first input/output port with the first signal and through the second input/output port with the fourth signal in the second mode of operation.

22. The device of claim 21, wherein the first mode of operation is a normal mode of operation, and the second mode of operation is a test mode of operation.

23. The device of claim 21, further comprising a port controller to generated at least one selected signal for accessing the second memory region, the port controller configured to select between the first signal from the first input/output port and the third signal from the second input/output port in response to a mode enabled signal.

24. The device of claim 23, further comprising a mode signal generator structured to generate the mode enabled signal based upon a selected mode of operation.

25. The device of claim 23, wherein the first and third signals each include a command signal and an address signal, and wherein the second and fourth signals each include a data signal.

26. The device of claim 25, further comprising:
a first command signal generator to synchronize a first command signal from the first signal with a first clock signal and a first chip enable signal; and
a second command signal generator to synchronize a first selected command signal from the port controller with a selected clock signal and a selected chip enable signal from the port controller.

27. The device of claim 26, wherein the selected clock signal and selected chip enable signal from the port controller are selected respectively from the first clock signal and first chip enable signal, and from a second clock signal and a second chip enable signal in response to the mode enabled signal.

28. The device of claim 26, wherein the selected clock signal and selected chip enable signal from the port controller are respectively a second clock signal and a second chip enable signal.

29. The device of claim 26, further comprising:
a first address synchronizing circuit to synchronize the first address signal from the first signal with the synchronized first command signal from the first command signal generator; and
a second address synchronizing circuit to synchronize the selected address signal from the port controller with the synchronized selected command signal from the second command signal generator.

* * * * *

UNITED STATES PATENT AND TRADEMARK OFFICE
CERTIFICATE OF CORRECTION

PATENT NO. : 7,499,364 B2  Page 1 of 1
APPLICATION NO. : 11/466415
DATED : March 3, 2009
INVENTOR(S) : Hyo-Joo Ahn et al.

It is certified that error appears in the above-identified patent and that said Letters Patent is hereby corrected as shown below:

Column 6, line 62, the word "13" should read -- I3 --;
Column 7, line 65, the words "15, 16, and 17" should read -- I5, I6, and I7 --;
Column 9, line 39, the word "CLK_1" should read -- CLK_1, --;
Column 11, line 56, the word "Port" should read -- port --.

Signed and Sealed this

First Day of September, 2009

David J. Kappos
*Director of the United States Patent and Trademark Office*